(12) United States Patent
Oike

(10) Patent No.: US 9,438,835 B2
(45) Date of Patent: Sep. 6, 2016

(54) SEMICONDUCTOR DEVICE

(71) Applicant: Sony Corporation, Tokyo (JP)

(72) Inventor: Yusuke Oike, Kanagawa (JP)

(73) Assignee: SONY SEMICONDUCTOR SOLUTIONS CORPORATION, Tokyo (JP)

( * ) Notice: Subject to any disclaimer, the term of this patent is extended or adjusted under 35 U.S.C. 154(b) by 48 days.

(21) Appl. No.: 14/602,924

(22) Filed: Jan. 22, 2015

(65) Prior Publication Data
US 2015/0215552 A1 Jul. 30, 2015

Related U.S. Application Data

(63) Continuation of application No. 12/642,398, filed on Dec. 18, 2009, now abandoned, which is a continuation of application No. 11/678,670, filed on Feb. 26, 2007, now Pat. No. 8,659,324.

(30) Foreign Application Priority Data

Feb. 27, 2006 (JP) ................................. 2006-049730

(51) Int. Cl.
| | |
|---|---|
| H04N 5/372 | (2011.01) |
| G11C 7/12 | (2006.01) |
| G11C 8/08 | (2006.01) |
| G11C 11/408 | (2006.01) |
| H03K 3/356 | (2006.01) |
| H03K 17/04 | (2006.01) |
| H03K 19/01 | (2006.01) |
| H04N 5/374 | (2011.01) |
| H04N 5/378 | (2011.01) |

(52) U.S. Cl.
CPC ................ *H04N 5/372* (2013.01); *G11C 7/12* (2013.01); *G11C 8/08* (2013.01); *G11C 11/4085* (2013.01); *H03K 3/356165* (2013.01); *H03K 17/04* (2013.01); *H03K 19/01* (2013.01); *H04N 5/374* (2013.01); *H04N 5/378* (2013.01)

(58) Field of Classification Search
CPC ............................ H04N 5/372; H04N 5/374
See application file for complete search history.

(56) References Cited

U.S. PATENT DOCUMENTS

| | | | |
|---|---|---|---|
| 4,896,300 A | 1/1990 | Shinagawa et al. | |
| 5,896,343 A | 4/1999 | Furumochi | |
| 6,798,451 B1 | 9/2004 | Suzuki et al. | |
| 6,850,089 B2* | 2/2005 | Huang | H03K 19/01707 326/21 |
| 7,049,863 B2 | 5/2006 | Bechman et al. | |
| 7,209,171 B2 | 4/2007 | Suzuki et al. | |
| 8,659,324 B2 | 2/2014 | Oike | |
| 2003/0160753 A1* | 8/2003 | McCartney | G09G 3/3611 345/99 |

FOREIGN PATENT DOCUMENTS

| | | |
|---|---|---|
| JP | 63-276793 | 11/1988 |
| JP | 03-225694 | 10/1991 |
| JP | 10-255477 | 9/1998 |
| JP | 2000-286692 | 10/2000 |
| JP | 2002-353312 | 12/2002 |
| JP | 2003-143485 | 5/2003 |

OTHER PUBLICATIONS

Japanese Patent Office Action issued in related Japanese Patent Application No. 2006-049730 dated Feb. 9, 2010.

* cited by examiner

*Primary Examiner* — James Hannett
(74) *Attorney, Agent, or Firm* — Dentons US LLP

(57) ABSTRACT

A semiconductor device is provided which has a driving circuit operable to drive a circuit that has a delay, the semiconductor device including: an auxiliary driving circuit operable to accelerate drive of the driving circuit, which receives a drive signal of the driving circuit as an input signal.

10 Claims, 24 Drawing Sheets

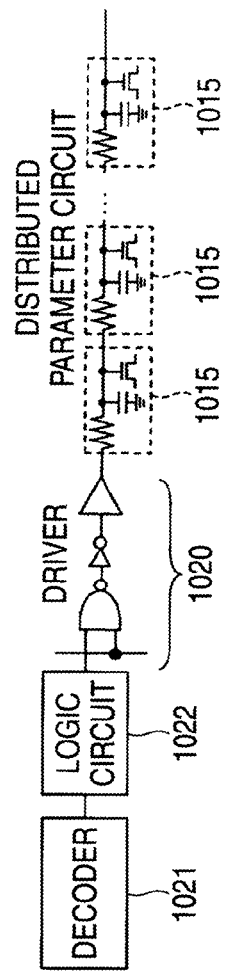

SEMICONDUCTOR DEVICE

This application is a continuation of U.S. patent application Ser. No. 12/642,398, filed Dec. 18, 2009, which is a continuation of U.S. patent application Ser. No. 11/678,670, filed Feb. 26, 2007, now U.S. Pat. No. 8,659,324 issued on Feb. 25, 2014, the entireties of which are incorporated herein by reference to the extent permitted bylaw. The present application claims the benefit of priority to Japanese Patent Application No. 2006-049730 filed in the Japanese Patent Office on Feb. 27, 2006, the entirety of which is incorporated by reference herein to the extent permitted by law.

BACKGROUND OF THE INVENTION

1. Field of the Invention

The present invention relates to a semiconductor device having a means for accelerating drive (or the invention belongs to the field of a semiconductor device).

2. Description of the Related Art

Most of control signals for a solid state imaging device (CMOS image sensor, CCD), a storage device (SRAM, DRAM, ROM, a flash memory, etc.), a programmable logic array (PLA) and so on are formed from a distributed parameter circuit, and the position of driving circuits is usually limited to the end of a control signal line because of its arrangement structure. Therefore, in the drive of the distributed parameter circuit, the difference in the delay time of the control signals is noticeable. Generally, the driving circuit has an address decoder part for addressing. The solid state imaging device often has a logic circuit which selects operation modes. As shown in FIG. 23, when loads 1015 of a distributed parameter circuit are driven by driving circuits 1020 and 1020 disposed at the both ends of the distributed parameter circuit, signal transmission is high speed, but it is necessary to dispose a decoder 1021 and a logic circuit 1022 at both ends, causing the necessity of a large area. Furthermore, the same signal line is wired at both ends, which leads to increases in the number of wirings and in power consumption. On the other hand, as shown in FIG. 24, when loads 1015 of a distributed parameter circuit is driven by a driving circuit 1020 from one side (for example, see JP-A-2003-143485 (Patent Reference 1)), the circuit area can be reduced greatly, but signal delay is noticeable in a load 1015 on the opposite side of the driving circuit 1020 connected, which leads to deteriorated circuit performance.

SUMMARY OF THE INVENTION

In drive on both ends in which a distributed constant load is driven from both ends, high speed signal transmission is realized, but a disadvantage occurs that a large scale address decoder and logic circuit cause an area increase to be noticeable. Furthermore, the same signal line is wired at both ends, which leads to problems of increases in the number of wirings and in power consumption. On the other hand, delay time is noticeable in drive on one side, which leads to a problem of deteriorated circuit performance.

Thus, it is desirable to efficiently reduce the circuit scale to decrease delay differences in a circuit for accelerating signal transmission.

An embodiment of the invention is a semiconductor device having a driving circuit operable to drive a circuit that has a delay, the semiconductor device including: an auxiliary driving circuit operable to accelerate drive of the driving circuit, which receives a drive signal of the driving circuit as an input signal.

In an embodiment of the invention, the driving circuit can be arranged on one side of the circuit that has a delay, and the auxiliary driving circuit which accelerates the drive of the driving circuit can be arranged on the other side of the circuit that has a delay. Therefore, the area of the driving circuit is reduced as well as the auxiliary driving circuit accelerates the drive of the driving circuit, allowing the implementation of high speed drive of the circuit that has a delay.

According to an embodiment of the invention, the auxiliary driving circuit is arranged which accelerates the drive of the driving circuit and receives the drive signal of the driving circuit as an input signal. Therefore, an advantage can be obtained that the drive of the driving circuit is accelerated by the auxiliary driving circuit to implement the high speed drive of the circuit that has a delay. Furthermore, it is unnecessary to dispose a large scale driving circuit on both ends of the circuit in order to drive the circuit at high speed, and it is sufficient to provide the driving circuit with a large scale area on one end of the circuit. Therefore, the circuit scale can be drastically reduced. As described above, according to an embodiment of the invention, high speed drive and the reduction in the circuit scale can be achieved at the same time.

BRIEF DESCRIPTION OF THE DRAWINGS

FIG. 24 shows a block diagram depicting the configuration of drive on one side in technique in the past.

DETAILED DESCRIPTION OF THE INVENTION

An embodiment of the invention will be described with reference to a block diagram shown in FIG. 1.

Figure 1:
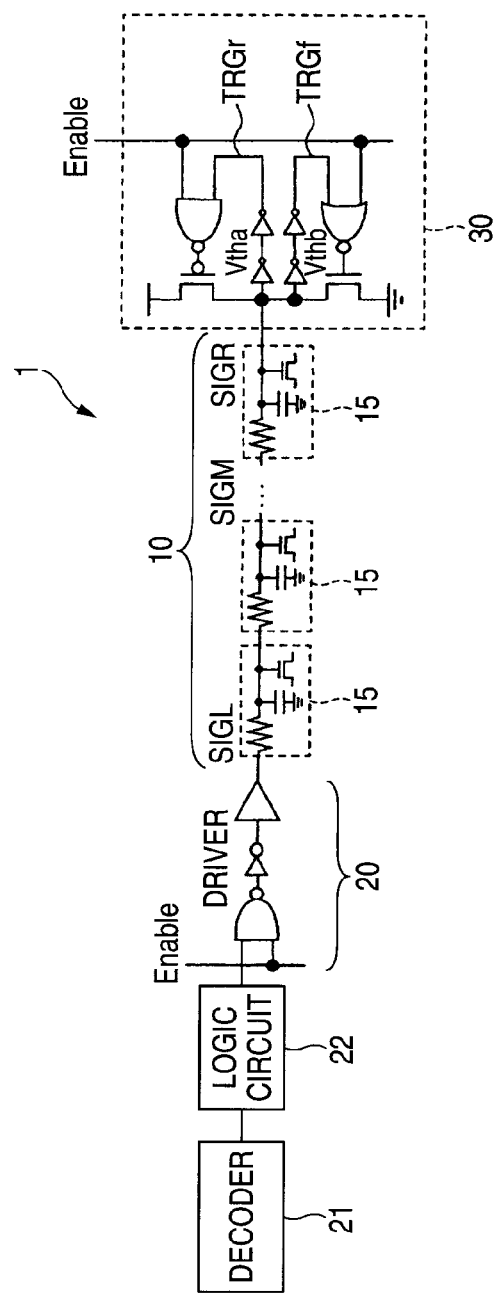
FIG. 1 shows a block diagram depicting an embodiment of the invention.

As shown in FIG. 1, a semiconductor device 1 has a circuit 10 (for example, a distributed parameter circuit). A driving circuit 20 operable to drive the circuit 10 is connected to one end of the circuit, and an auxiliary driving circuit 30 operable to accelerate the drive of the driving circuit 20 is connected to the other end of the circuit 10, which receives the drive signal of the driving circuit 20 as an input signal. As one example, the auxiliary driving circuit 30 receives the drive signal of the circuit 10 as an input signal at a level sense circuit (one of NOT elements) formed of a logic having a logic threshold Vtha, an output signal and an Enable signal of the level sense circuit enter an NAND circuit, and an output signal of the NAND circuit enters the gate of a MOS transistor to turn to the ON state to rise drive. Furthermore, it receives the drive signal of the circuit 10 as an input signal at a level sense circuit (the other NOT element) formed of a logic having a logic threshold Vthb, an output signal and an Enable signal of the level sense circuit enter a NOR circuit, and an output signal of the NOR circuit enters the gate of the MOS transistor turn to the ON state to fall drive. Here, the auxiliary driving circuit 30 is connected to one end of the circuit, but it may be connected to any position in the circuit, or a plurality of auxiliary driving circuits may be disposed. These embodiments will be described later in detail.

As an example, a decoder 21 is connected to the driving circuit 20 through a logic circuit 22. The auxiliary driving circuit 30 monitors the signal level of a control signal line (the load of the circuit 10) 11. When it confirms a transition, it starts driving the control signal line 11 . Since the control signal line 11 is a trigger, the decoder and the logic circuit are unnecessary. In this example, the Enable signal that is the trigger for the driving circuit 20 is an activation signal for the auxiliary driving circuit 30. The circuit configuration of the auxiliary driving circuit 30, shown, is an example. Such a circuit configuration may be sufficient in which the drive signal is received as the input signal to accelerate the drive of the driving circuit 20.

Figure 2:
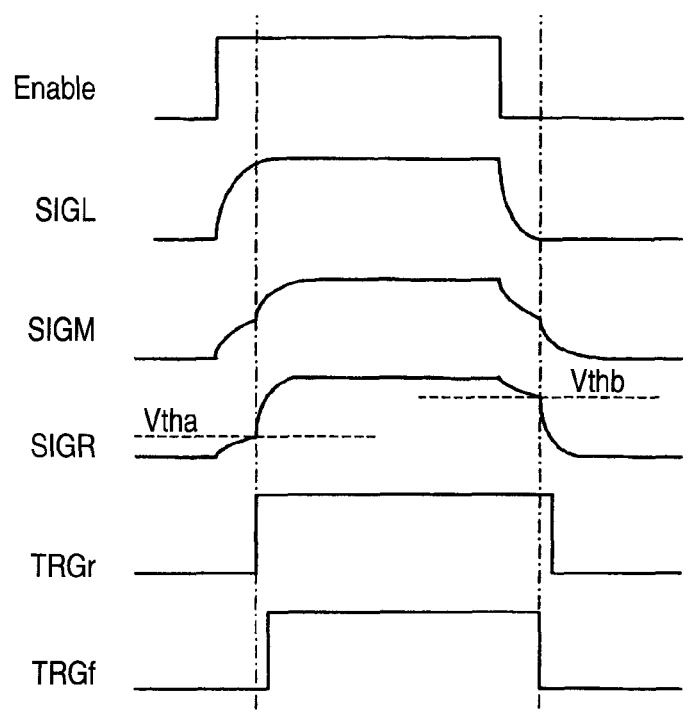
FIG. 2 shows a timing chart depicting the operation of an auxiliary driving circuit according to an embodiment of the invention.

Next, FIG. 2 shows a timing chart depicting the operation of the auxiliary driving circuit 30 performed when the circuit 10 is selected by the decoder 21 and the logic circuit 22. Here, the Enable signal is the trigger signal for the driving circuit 20. SIGL, SIGM, and SIGR are voltages at the left end, the center, and the right end of the circuit 10, respectively. TRGr and TRGf are voltage of the internal signals of the auxiliary driving circuit 30. Vtha and Vthb are logic thresholds for the logic circuits that receive the control signal line 11 as input.

As shown in FIG. 2, when the Enable signal turns high, the driving circuit 20 turns the control signal line 11 to high level. At this time, the drive rises quickly at the left end (the voltage SIGL at the left end), whereas the drive rises slowly at the center (the voltage SIGM at the center) and the right end (the voltage SIGR at the right end) because of a distributed constant load. When the signal at the right end (the voltage SIGR at the right end) exceeds the logic threshold Vtha, the internal signal TRGr of the auxiliary driving circuit 30 is changed. Since the Enable signal is high, the auxiliary driving circuit 30 supplies high level to the control signal line 11 to accelerate the rising signal transition. In addition, the Enable signal turns high, and thus the transistor that supplies the low level of the auxiliary driving circuit 30 is forcedly disabled.

When the Enable signal turns low, the low level propagates from the left end, and at the right end, the level is slowly changed similarly. At this time, the transistor that supplies the high level of the auxiliary driving circuit 30 is forcedly disabled by the Enable signal. When the voltage SIGR at the right end exceeds Vthb, the internal signal TRGf of the auxiliary driving circuit 30 is changed, and the auxiliary driving circuit 30 supplies low level to the control signal line 11. Thus, the falling signal transition is accelerated.

The logic having the control signal line 11 of the auxiliary driving circuit 30 as input may share the same circuit both at high level and low level. However, separation allows each logic level to be made different, which makes a driver that can more efficiently accelerate drive. For example, the logic threshold Vtha is set low in acceleration of drive at the rising edge, the logic threshold Vthb is set high in acceleration of drive at the falling edge, and thus the timing to drive the auxiliary driving circuit 30 can speed up at each level. The description of this example will be described later in detail.

Furthermore, the auxiliary driving circuit can be arranged not only for high level and low level but also for a plurality of given voltage supplies. For example, when four types of voltages are supplied, the acceleration driver can be arranged for two types of voltages among them. Thus, the efficiency of the circuit area can be increased. The description of this example will be described later in detail.

Next, the auxiliary driving circuit 30 will be described in detail. In the description below, the circuit 10 is considered to be a distributed parameter circuit.

Figure 3A:
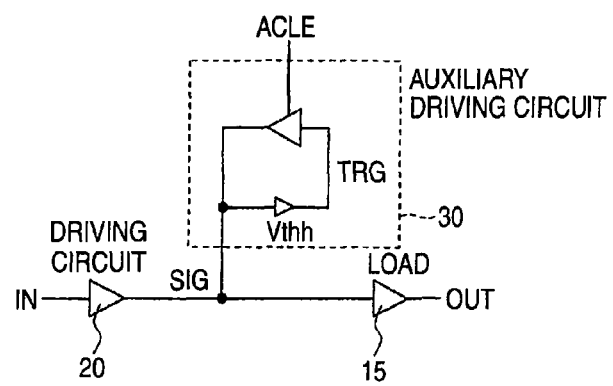
FIG. 3A shows a block diagram depicting an exemplary configuration of the auxiliary driving circuit.
Figure 3B:
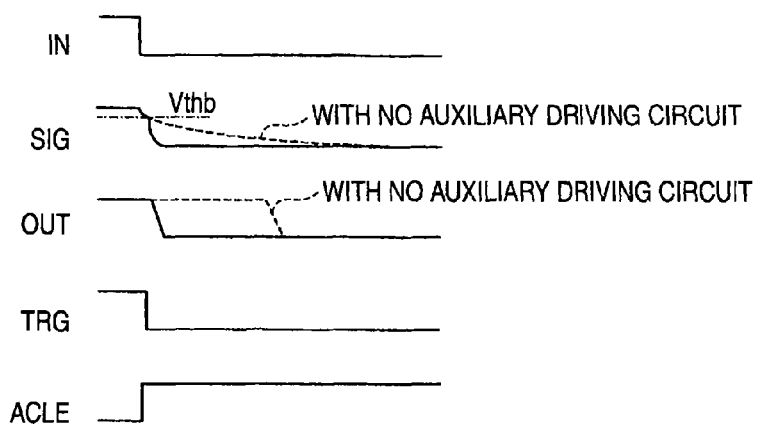
FIG. 3B shows a timing chart of the auxiliary driving circuit.

FIG. 3A shows the configuration of an auxiliary driving circuit 301 which receives the driven signal itself as input for acceleration, and FIG. 3B shows a timing chart depicting the auxiliary driving circuit 301.

As shown in FIGS. 3A and 3B, an input IN changes from low level to high level, whereby a driving circuit 20 drives a distributed parameter circuit SIG.

When the distributed parameter circuit SIG has a load 15, a delay occurs in the signal transition as indicated by a dotted line. When the auxiliary driving circuit 30 is activated by the activation signal ACLE of the auxiliary driving circuit, which switches activation/deactivation of the auxiliary driving circuit 30, the voltage TRG of the internal signal of the auxiliary driving circuit 30 changes at the time when the distributed parameter circuit SIG exceeds the logic threshold Vth, and then the auxiliary driving circuit 30 drives the distributed parameter circuit SIG. Thus, an advantage can be obtained that accelerates the signal transition of the distributed parameter circuit SIG.

Figure 4A:
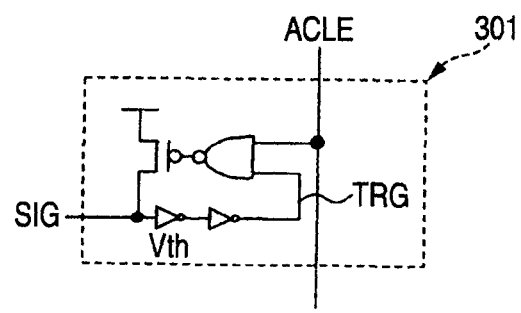
FIGS. 4A and 4B show block diagrams depicting an exemplary configuration of the auxiliary driving circuit.
Figure 4B:
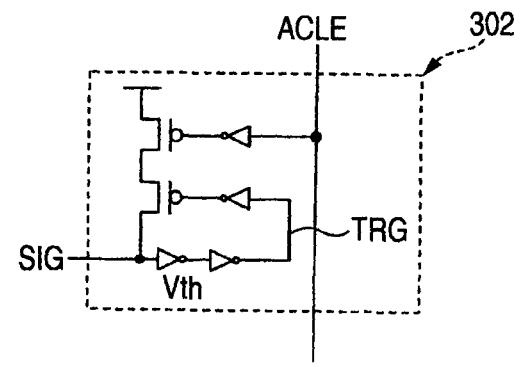
Figure 5A:
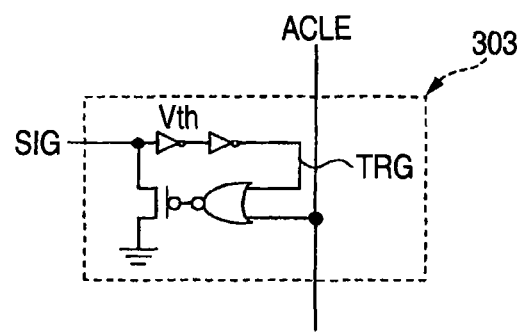
FIGS. 5A and 5B show block diagrams depicting an exemplary configuration of the auxiliary driving circuit.
Figure 5B:
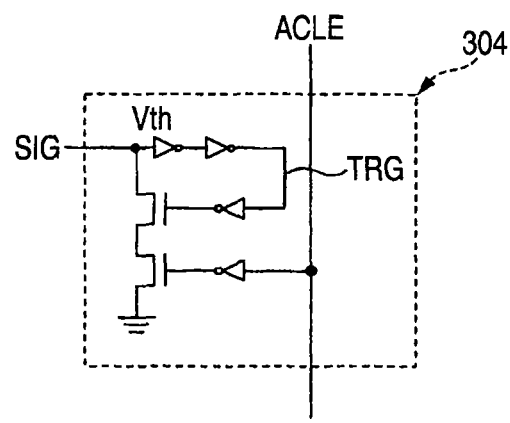
Figure 6A:
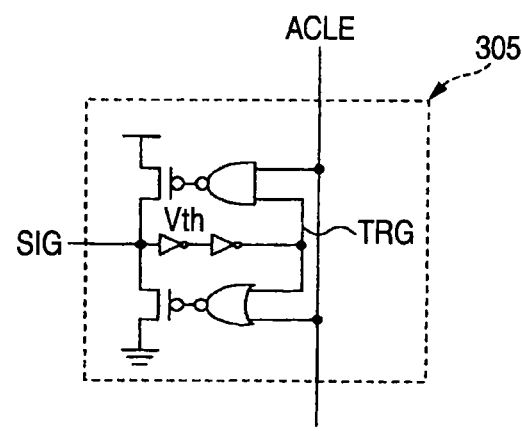
FIGS. 6A and 6B show block diagrams depicting an exemplary configuration of the auxiliary driving circuit.
Figure 6B:
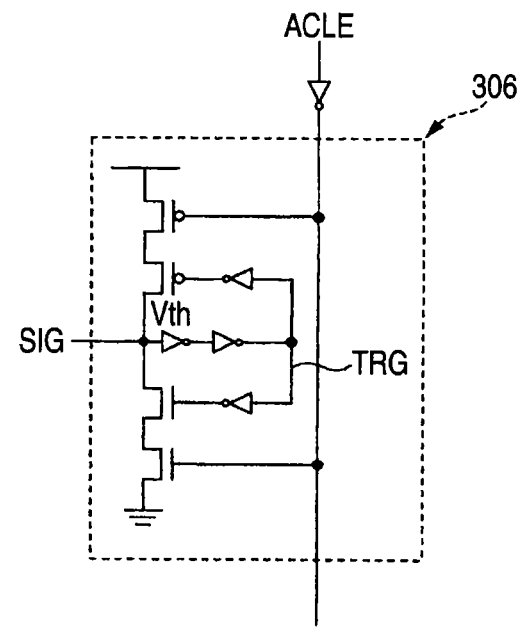

FIGS. 4A and 4B show block diagrams depicting an exemplary auxiliary driving circuit which accelerates the rising edge, FIGS. 5A and 5B show block diagrams depicting an exemplary auxiliary driving circuit which accelerates the falling edge, and FIGS. 6A and 6B show block diagrams depicting an exemplary auxiliary driving circuit which accelerates both of the rising edge and the falling edge.

As shown in FIG. 4A, an auxiliary driving circuit 301 which accelerates the rising edge uses an AND logic, configured of an AND circuit which receives as input the output signal of a NOT element having the input signal SIG from the circuit and the activation signal ACLE of the auxiliary driving circuit, and of a MOS transistor in which the output signal is inputted to the gate.

As shown in FIG. 4B, an auxiliary driving circuit 302 which accelerates the rising edge is configured in which a NOT element having the input signal SIG from the circuit as input is serially connected to a NOT circuit, the output signal is inputted to the gate of a first MOS transistor, the activation signal ACLE of the auxiliary driving circuit is inputted to a NOT circuit, its output signal is inputted to the gate of a second MOS transistor serially connected to the first MOS transistor, and the first MOS transistor is connected to an input signal line.

As shown in FIG. 5A, an auxiliary driving circuit 303 which accelerates the falling edge uses a NAND logic, configured of a NAND circuit which receives as input the output signal of a NOT element having the input signal SIG from the circuit and the activation signal ACLE of the auxiliary driving circuit, and of MOS transistors in which the output signal is inputted to the gate, and one of the MOS transistors is connected to the input signal line side and the other is grounded.

As shown in FIG. 5B, an auxiliary driving circuit 304 which accelerates the falling edge is configured in which a NOT element having the input signal SIG from the circuit is serially connected to a NOT circuit, the output signal is inputted to the gate of a first MOS transistor, the activation signal ACLE of the auxiliary driving circuit is inputted to a NOT circuit, its output signal is inputted to the gate of a second MOS transistor serially connected to the first MOS transistor, the first MOS transistor is connected to an input signal line, and the second MOS transistor is grounded.

As shown in FIG. 6A, an auxiliary driving circuit 305 has a level sense circuit having one logic threshold Vth, which drives both of the rising edge and the falling edge. This auxiliary driving circuit 305 has the combined function of the auxiliary driving circuit 301 described in FIG. 4A and the auxiliary driving circuit 303 described in FIG. 5A, configured to share the level sense circuit formed of NOT elements.

As shown in FIG. 6B, an auxiliary driving circuit 306 has a level sense circuit having one logic threshold Vth, which drives the rising edge and the falling edge. This auxiliary driving circuit 306 the combined function of the auxiliary driving circuit 302 described in FIG. 4B and the auxiliary driving circuit 304 described in FIG. 5B, configured to share the level sense circuit formed of NOT elements.

Next, the logic threshold Vth which decides the timing of the rising edge and the falling edge will be described.

Figure 7A:
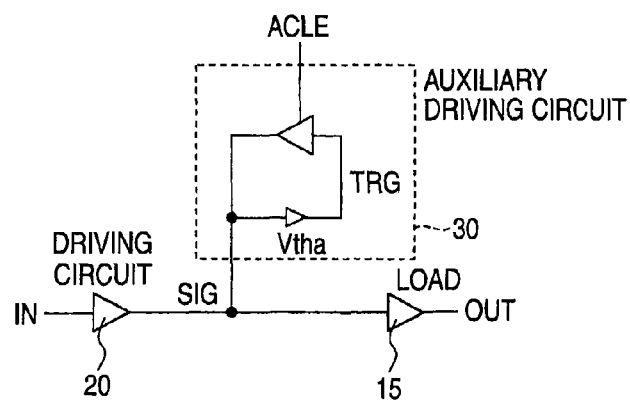
FIG. 7A shows a block diagram depicting an exemplary configuration of the auxiliary driving circuit.
Figure 7B:
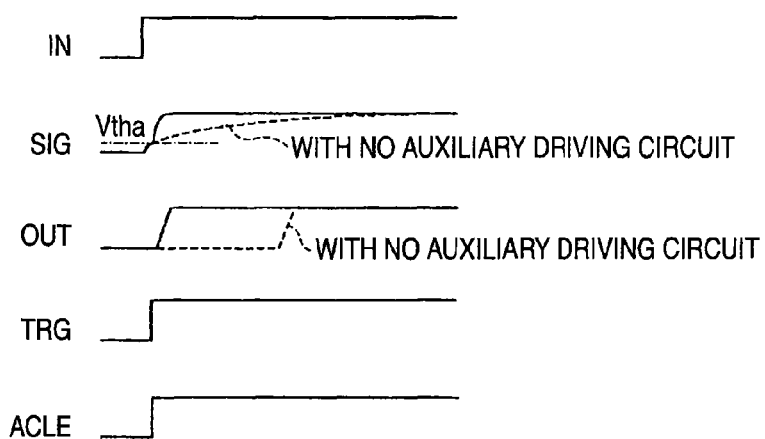
FIG. 7B shows a timing chart depicting the rising edge of the auxiliary driving circuit.

For example, in the case in which the auxiliary driving circuit 30 supports the drive at the rising edge, FIG. 7A shows the configuration in which a logic threshold Vtha of the logic circuit is set low that receives the driven signal of an auxiliary driving circuit 30 as input, and FIG. 7B shows a timing chart. The logic threshold Vtha is the logic threshold that is lower than usual. For example, it is set lower than the middle level of ground level (low level) and high level. In addition, a dotted line shows the case in which there is no auxiliary driving circuit.

As shown in FIG. 7A and 7B, the input IN changes from low level to high level to drive a distributed parameter circuit by a driving circuit 20. When the distributed parameter circuit has a load 15, the signal transition traces a slow rising edge indicated by a dotted line, and a delay occurs. When the auxiliary driving circuit 30 is activated by the activation signal ACLE of the auxiliary driving circuit which switches activation/deactivation of the auxiliary driving circuit 30, the voltage TRG of the internal signal of the auxiliary driving circuit 30 changes at the time when the voltage SIG of the distributed parameter circuit exceeds the logic threshold Vtha, and the auxiliary driving circuit 30 changes the voltage SIG of the distributed parameter circuit. The logic threshold Vtha is set low, that is, it is set to the value closer to low level, whereby the rising edge of the voltage SIG of the distributed parameter circuit can be accelerated. Accordingly, an advantage can be obtained that accelerates the transition of the voltage SIG of the distributed parameter circuit.

As described above, the logic threshold Vtha is lowered to acquire changes in the voltage SIG of the distributed parameter circuit driven at the rising edge by the driving circuit at an earlier point in time, and an advantage can be obtained that accelerates the transition of the voltage SIG of the distributed parameter circuit.

Figure 8A:
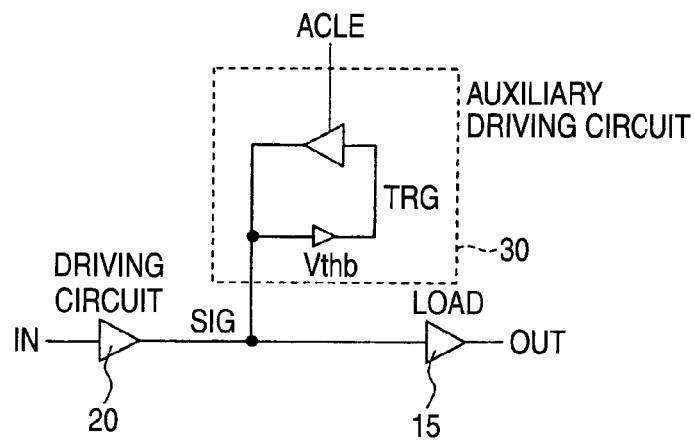
FIG. 8A shows a block diagram depicting an exemplary configuration of the auxiliary driving circuit.
Figure 8B:
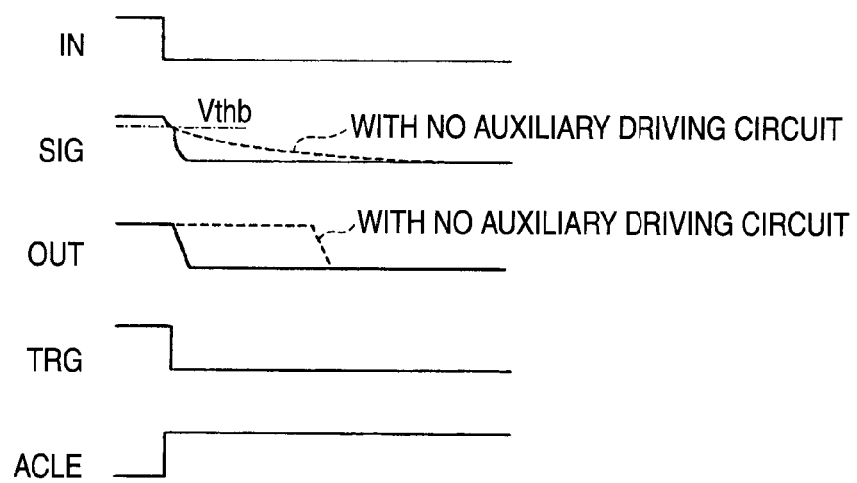
FIG. 8B shows a timing chart depicting the falling edge of the auxiliary driving circuit.

For example, in the case in which the auxiliary driving circuit 30 supports the drive at the falling edge, FIG. 8A shows the configuration in which a logic threshold Vthb of a logic circuit having the driven signal of an auxiliary driving circuit 30 as input is set higher, and FIG. 8B shows a timing chart. The logic threshold Vthb is a logic threshold that is higher than usual, and set higher than the middle level between ground level (low level) and high level, for example. In addition, a dotted line shows the case in which there is no auxiliary driving circuit.

As shown in FIGS. 8A and 8B, the input IN changes from high level to low level to stop a distributed parameter circuit by a driving circuit 20. When the distributed parameter circuit has a load 15, the signal transition traces a slow falling edge as indicated by a dotted line, and a delay occurs. When the auxiliary driving circuit 30 is activated by the activation signal ACLE of the auxiliary driving circuit which switches activation/deactivation of the auxiliary driving circuit 30, the voltage TRG of the internal signal of the auxiliary driving circuit 30 changes at the time when the voltage SIG of the distributed parameter circuit is equal to the logic threshold Vthb or below, and the auxiliary driving circuit 30 changes the voltage SIG of the distributed parameter circuit. The logic threshold Vthb is set higher, that is, it is set to the value closer to high level, whereby the falling edge of the voltage SIG of the distributed parameter circuit can be accelerated. Accordingly, an advantage can be obtained that accelerates the transition of the voltage SIG of the distributed parameter circuit.

As described above, the logic threshold Vthb is set higher to acquire changes in the voltage SIG of the distributed parameter circuit driven at the falling edge by the driving circuit at an earlier point in time, whereby the start of the operation of the auxiliary driving circuit 30 can speed up.

Figure 9A:
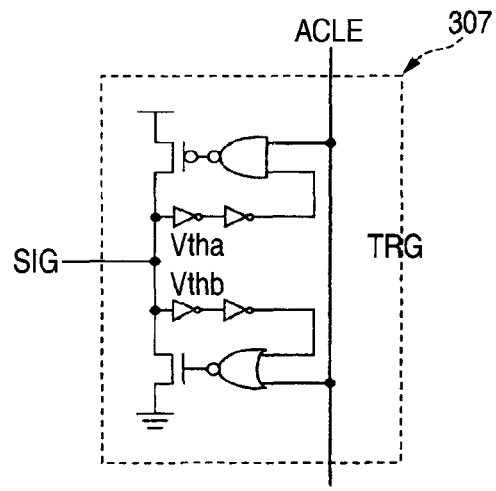
FIGS. 9A and 9B show block diagrams depicting an exemplary configuration of the auxiliary driving circuit.
Figure 9B:
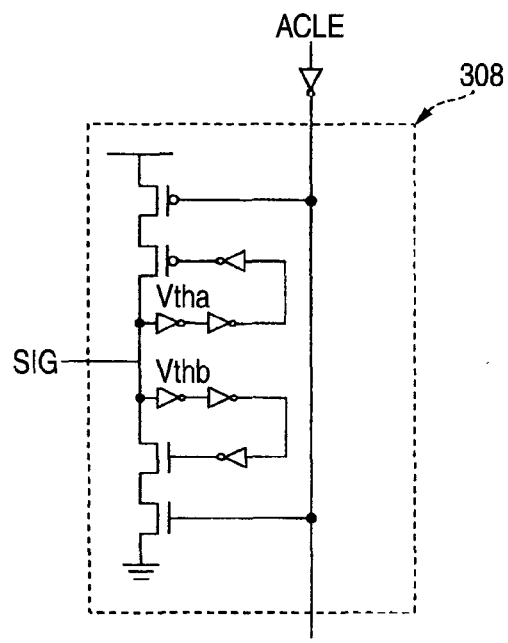

Next, FIGS. 9A and 9B show an exemplary circuit in which different voltages are provided to the logic threshold Vtha to support the rising edge and to the logic threshold Vthb to support the falling edge. Preferably, setting Vtha to the voltage lower than Vthb sets Vtha to the voltage closer to low level and sets Vthb to the voltage closer to high level, whereby the operations of the configurations described in FIGS. 7A, 7B, 8A and 8B can be combined.

As shown in FIG. 9A, an auxiliary driving circuit 307 has two logic threshold Vtha and logic threshold Vthb, having a level sense circuit with the logic threshold Vtha, and a level sense circuit with the the logic threshold Vthb in which both of the rising edge and the falling edge are driven. More specifically, the auxiliary driving circuit 307 has the combined function of the auxiliary driving circuit 301 described in FIG. 4A and the auxiliary driving circuit 303 described in FIG. 5A.

As shown in FIG. 9B, an auxiliary driving circuit 308 has two logic threshold Vtha and logic threshold Vthb, having a level sense circuit with the logic threshold Vtha and a level sense circuit with the logic threshold Vthb in which both of the rising edge and the falling edge are driven. More specifically, the auxiliary driving circuit 308 has the combined function of the auxiliary driving circuit 302 described in FIG. 4B and the auxiliary driving circuit 304 described in FIG. 5B.

As described above, different voltages are provided to the logic threshold Vtha to support the rising edge and to the logic threshold Vthb to support the falling edge, whereby the logic threshold Vtha and the logic threshold Vthb can be set separately. Therefore, both of the rising edge and the falling edge can be driven at higher speed.

Next, a semiconductor device having auxiliary driving circuits in which a plurality of voltages is supplied to a driving circuit and the auxiliary driving circuits perform acceleration in accordance with a single or a plurality of drives driven by the voltages will be described with reference to a circuit diagram shown in FIG. 10 and a timing chart shown in FIG. 11.

Figure 10:
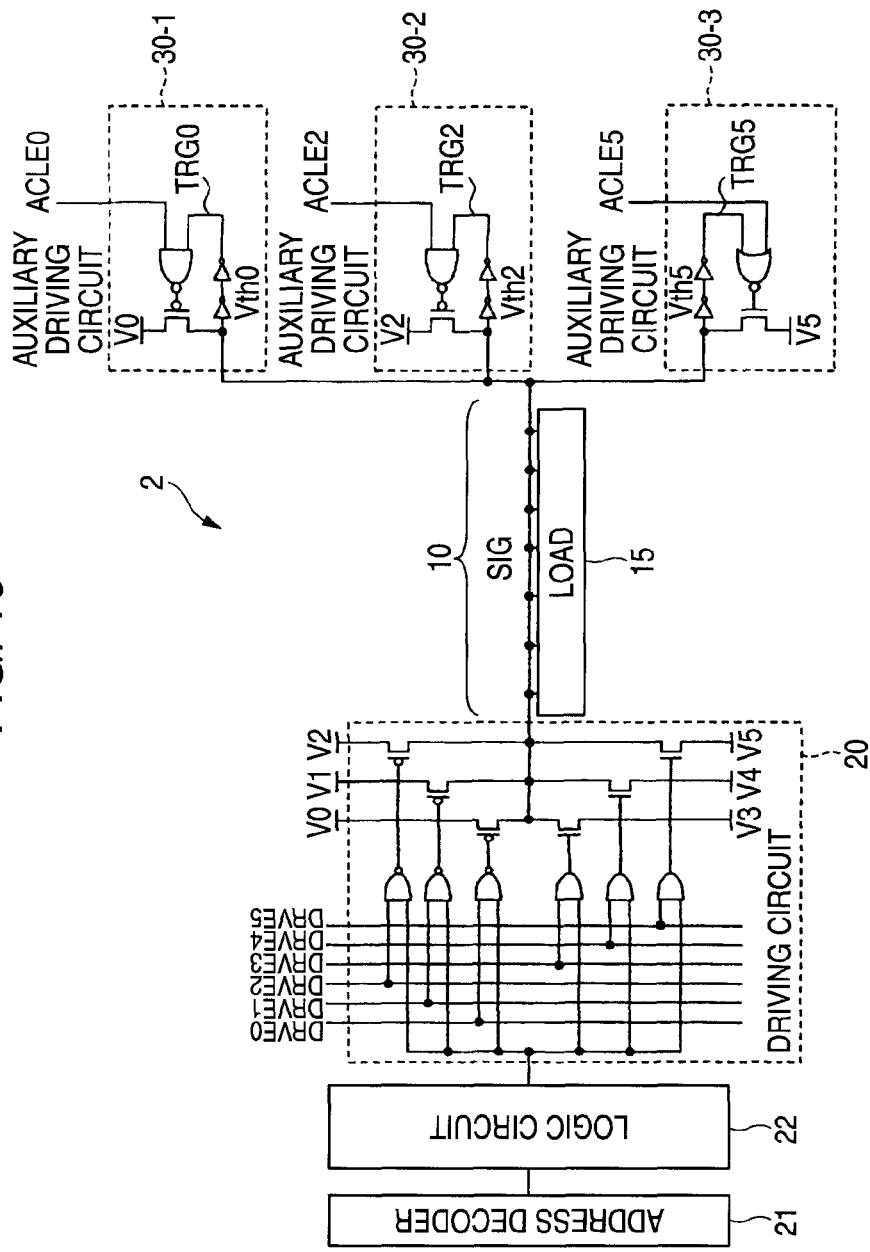
FIG. 10 shows a block diagram depicting an embodiment of the invention.

As shown in FIG. 10, a semiconductor device 2 has a circuit 10 (for example, a distributed parameter circuit) that has a load 15. A driving circuit 20 which drives the circuit 10 is connected to one end of the circuit, and a plurality of auxiliary driving circuits 30-1, 30-2 and 30-3 which accelerate the drive of the driving circuit 20 is connected to the other end of the circuit 10 as the auxiliary driving circuits receive the drive signal of the driving circuit 20 as an input signal. For the auxiliary driving circuits 30-1 to 30-3, the auxiliary driving circuit having the circuit configuration described in FIGS. 4A to 6B, and FIGS. 9A and 9B can be adapted. Furthermore, as an example, a decoder 21 (for example, an address decoder) is connected to the driving circuit 20 through a logic circuit 22.

Since the driving circuit drives the load 15 at six types of voltages, V0, V1, V2, V3, V4, and V5, the driving circuit 20 is supplied with a plurality of voltages DRVE0 to DRVE5. Then, only when the driving circuit 20 is supplied at voltages V0, V2, and V5, the drive is accelerated by the auxiliary driving circuits 30-1, 30-2 and 30-3.

Figure 11:
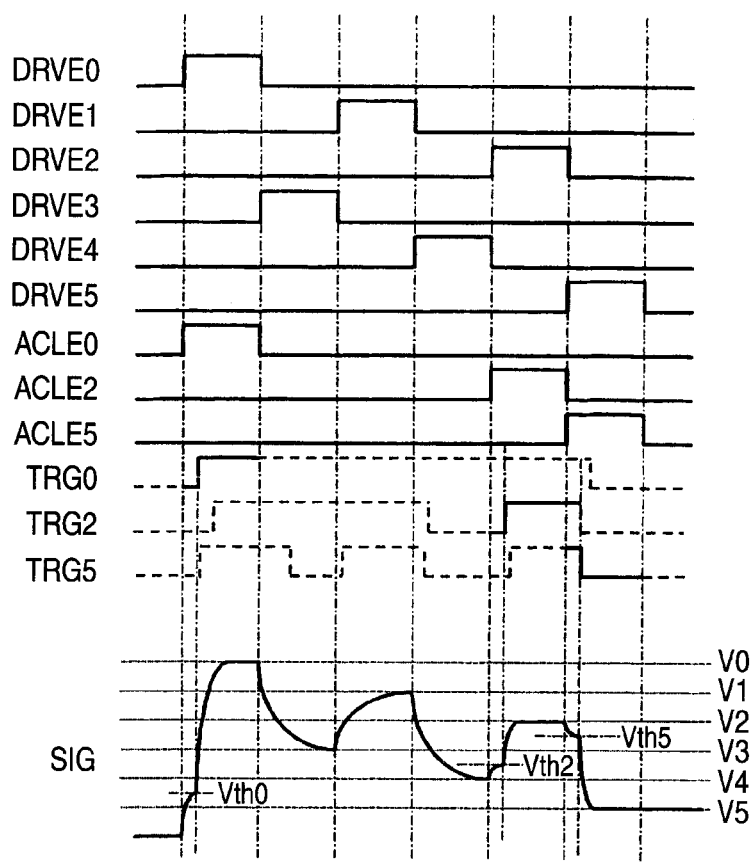
FIG. 11 shows a timing chart depicting the operation of the auxiliary driving circuit shown in FIG. 10.

As shown in FIG. 11, when the load is separately driven in order of voltages DRVE0 (V0), DRVE3 (V3), DRVE1 (V1), DRVE4 (V4), DRVE2 (V2), and DRVE5 (V5), the auxiliary driving circuit 30 reflects the transition of the voltage TRGi (TRG0, TRG2, and TRG5) of the internal signal in the drive of the rising edge or the falling edge of the voltage SIG of the signal line (for example, a control line of the distributed parameter circuit) only in the case in which the auxiliary driving circuit 30 is activated at a proper timing with the activation signal ACLEi (ACLE0, ACLE2, and ACLE5) of the auxiliary driving circuit.

The voltage TRGi (TRG0, TRG2, and TRG5) signal of the internal signal when the auxiliary driving circuit 30 is activated is indicated by solid lines. A delay is noticeable in the drive at the voltage with no auxiliary driving circuit due to the load of the signal line as indicated by dotted lines. However, in the drive at the voltage with the auxiliary driving circuit 30, changes in the voltage SIG of the signal line are sensed by the logic threshold Vthi (Vth0, Vth2, an dVth5), and the transition of the voltage SIG of the signal line is accelerated. More specifically, drive is accelerated.

As described above, the auxiliary driving circuit is operated with respect to a specific voltage that drives the load, whereby the auxiliary driving circuit is activated only when the performance of the circuit is affected by a delay in particular, for example. The drive is performed in a normal way other than such drive, whereby the auxiliary driving circuit can be mounted flexibly in accordance with the properties and performance of the circuit, and the circuit area can be reduced efficiently.

Figure 12:
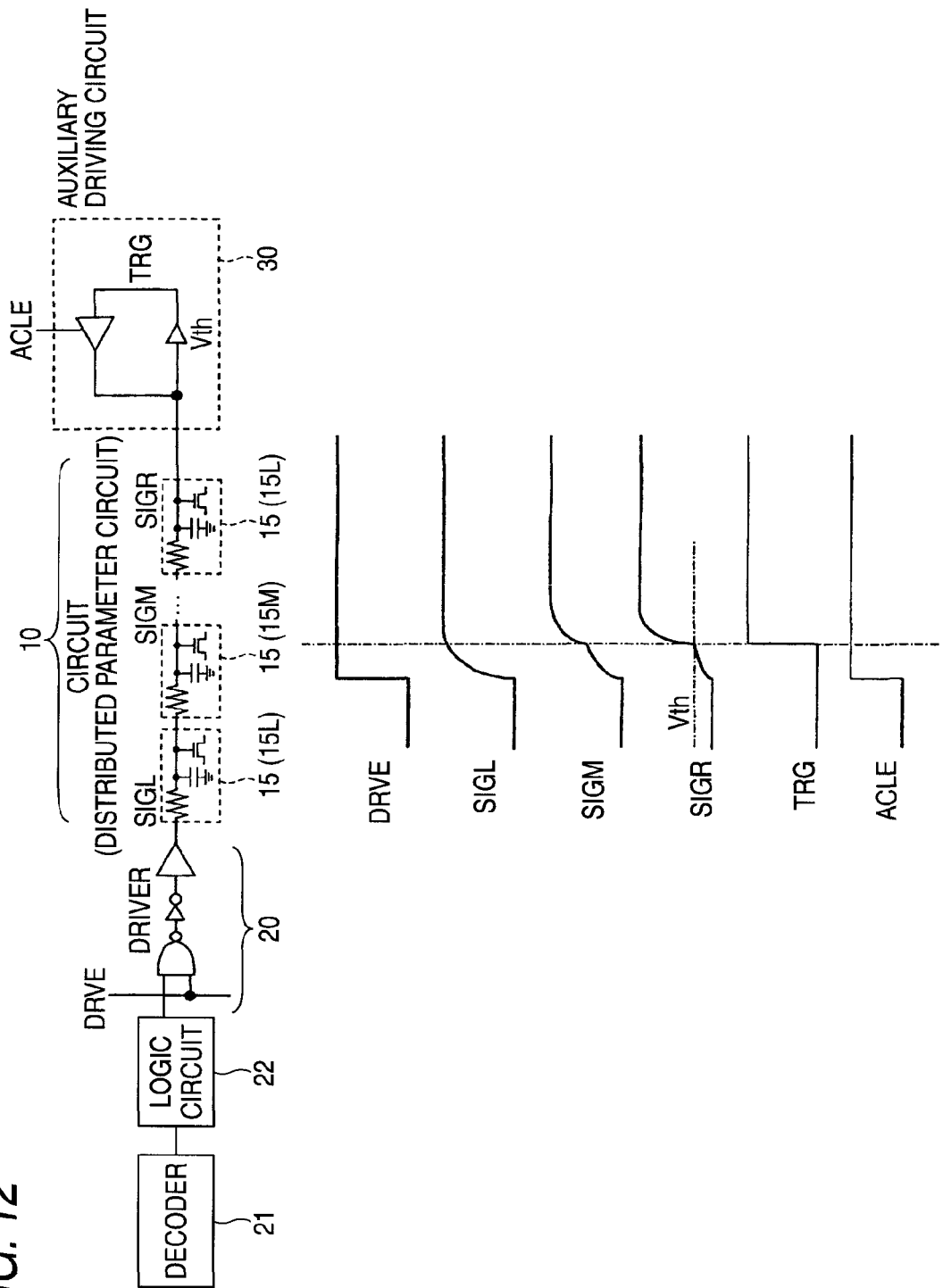
FIG. 12 shows a block diagram depicting an embodiment of the invention and a timing chart depicting the operation of the auxiliary driving circuit.

In the description above, as shown in FIG. 12, the configuration has been described in which in addition to the driving circuit 20 which drives the circuit (distributed parameter circuit) 10, the auxiliary driving circuits 30 are disposed at the right end of the distributed parameter circuit 10. In this configuration, when signals generated by a decoder 21 and a logic circuit 22 propagate through loads 15 of a distributed parameter circuit 10 by a driving circuit 20, a voltage SIGL of a load 15L close to the driving circuit 20 changes at high speed, but a delay might occur in a voltage SIGM of a load 15M in the middle of the distributed parameter circuit 10, and in a voltage SIMR of a load 15R at the right end.

Then, an exemplary configuration in which the auxiliary driving circuit 30 is provided at the middle point of the distributed parameter circuit 10 and at a plurality of points on the opposite side of the driving circuit 20 will be described with reference to FIG. 13.

Figure 13:
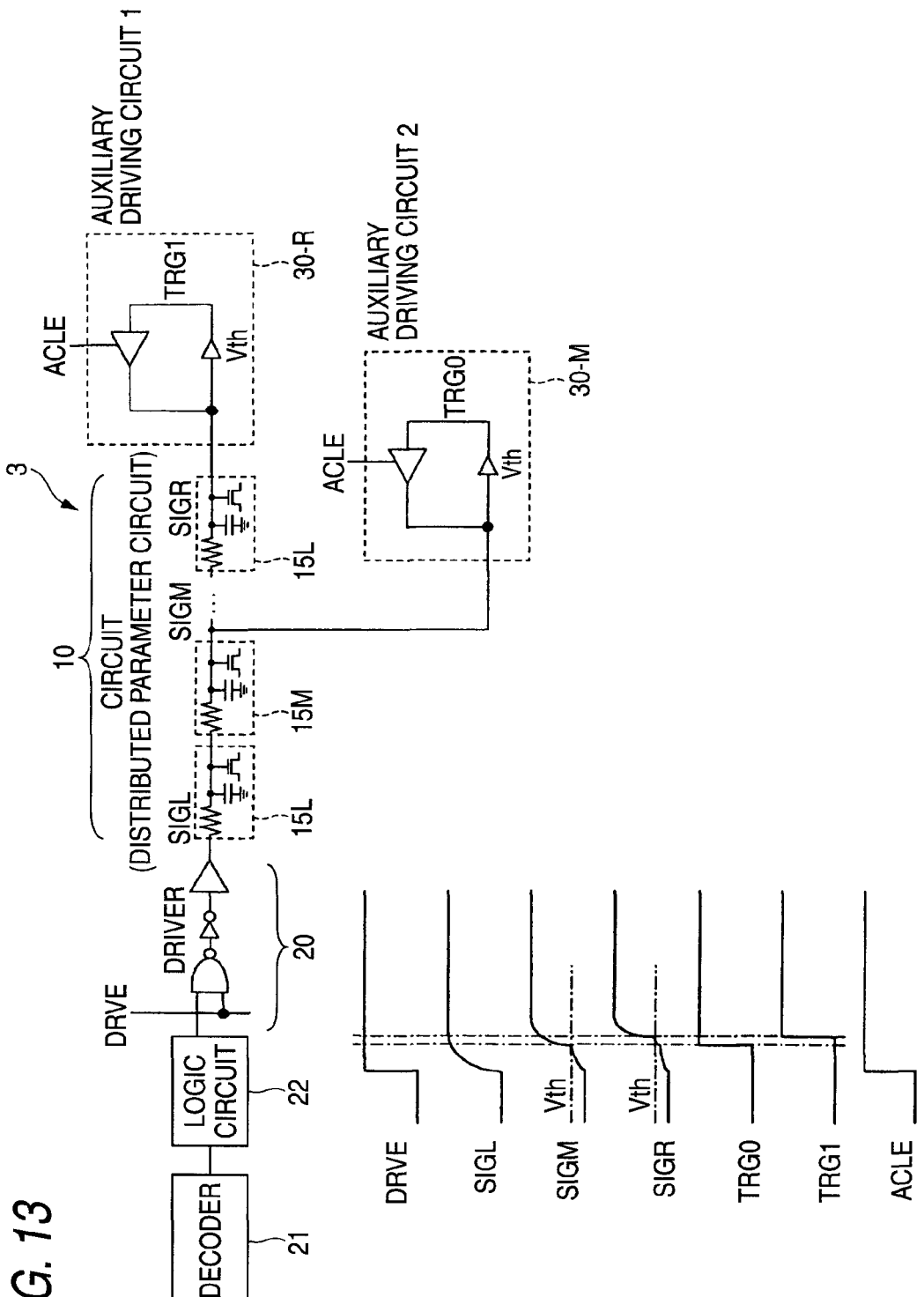
FIG. 13 shows a block diagram depicting an embodiment of the invention and a timing chart depicting the operation of the auxiliary driving circuit.

As shown in FIG. 13, in a semiconductor device 3, when a drive signal DRVE of a driving circuit is inputted to a driving circuit 20, a voltage SIGL of a load 15L at the left end of a distributed parameter circuit 10 rises. Then, the signal driven at the left end of the distributed parameter circuit 10 propagates through the distributed parameter circuit 10. An auxiliary driving circuit 30-M is activated when a voltage SIGM of a load 15M at the middle point exceeds the logic threshold Vth, and the voltage SIGM changes to accelerate the drive of the load 15M at the middle point. An auxiliary driving circuit 30-R is similarly activated when a voltage SIGR of a load 15R at the right end of the distributed parameter circuit 10 exceeds the logic threshold Vth, and the voltage SIGL changes to accelerate the drive of the load 15R at the right end.

In the semiconductor device 3, the auxiliary driving circuit 30-M is provided at the middle point of the distributed parameter circuit 10, but a plurality of auxiliary driving circuits may be provided at given points in the distributed parameter circuit 10. Particularly, when the distributed parameter circuit 10 is extremely long, it becomes effective for high speed drive to arrange a plurality of auxiliary driving circuits at predetermined intervals, for example.

In the configuration in which the auxiliary driving circuit 30 is provided at a plurality of points, the drive of the distributed parameter circuit 10 is accelerated. Since the auxiliary driving circuit 30 can omit the decoder and the logic circuit provided to the driving circuit 20, the circuit scale is reduced to decrease the circuit area. In addition, the auxiliary driving circuit can be provided in multiple numbers at given points in the distributed parameter circuit 10, and thus high speed drive is feasible.

The activation signal ACLE of the auxiliary driving circuit can be the same as the drive signal of the driving circuit accelerated by the auxiliary driving circuit. An exemplary configuration of this case will be described with reference to a block diagram and a timing chart shown in FIG. 14.

Figure 14:
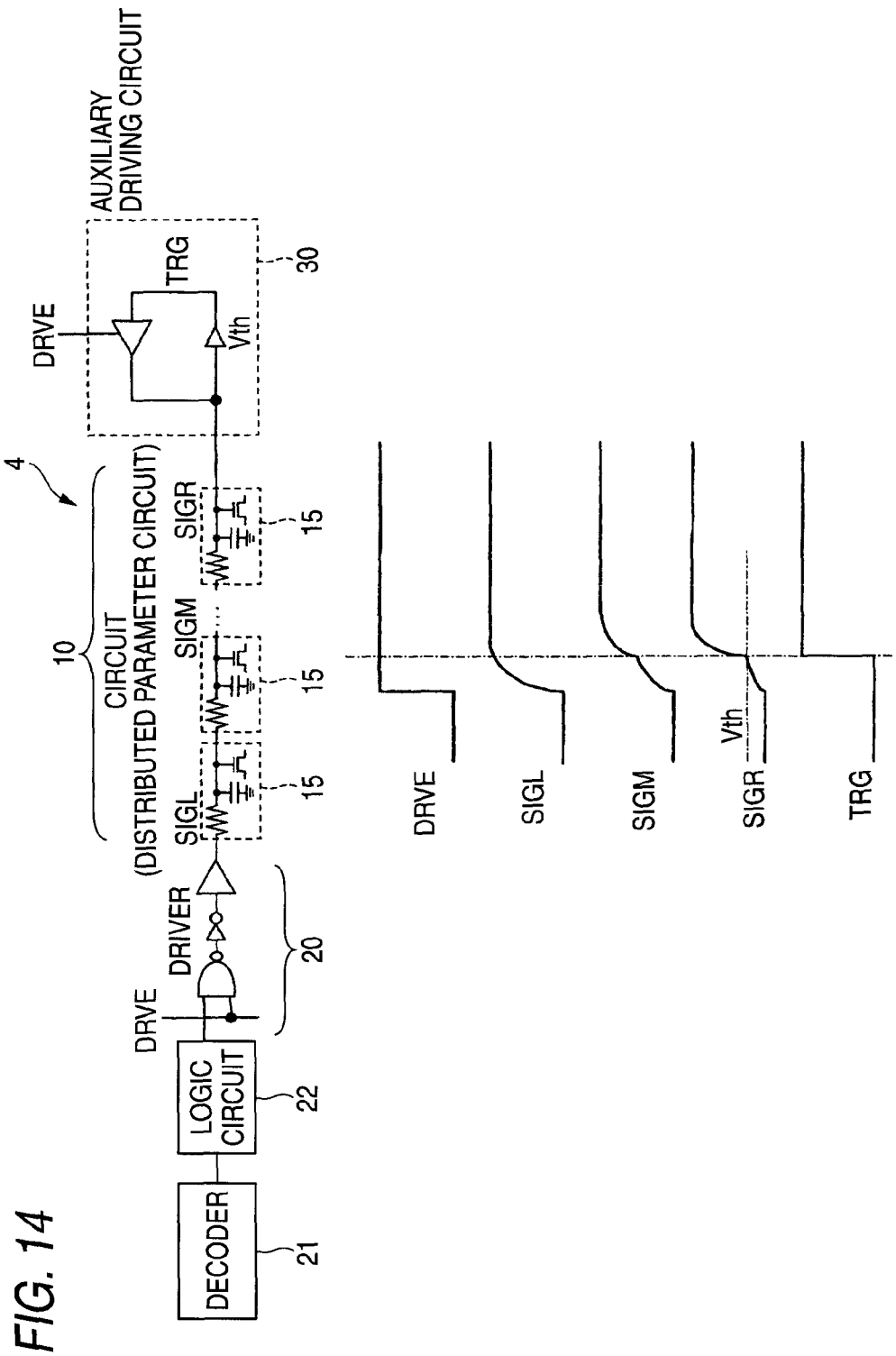
FIG. 14 shows a block diagram depicting an embodiment of the invention and a timing chart depicting the operation of the auxiliary driving circuit.

As shown in FIG. 14, in a semiconductor device 4, a circuit 10 (for example, a distributed parameter circuit) that has loads 15 is provided. A driving circuit 20 which drives the circuit 10 is connected to one end of the circuit, and an auxiliary driving circuit 30 which accelerates the drive of the driving circuit 20 is connected to the other end of the circuit 10, as the auxiliary driving circuit receives the drive signal of the driving circuit 20 as an input signal. For the auxiliary driving circuit 30, the auxiliary driving circuit having the circuit configuration described in FIGS. 4A to 6B, and FIGS. 9A and 9B can be adapted. Furthermore, as an example, a decoder (an address decoder) 21 is connected to the driving circuit 20 through a logic circuit 22.

To the auxiliary driving circuit 30, an activation signal ACLE is supplied which switches whether the auxiliary driving circuit 30 is activated or deactivated. The activation signal ACLE can be the same as a drive signal DRVE of the driving circuit 20. Therefore, the auxiliary driving circuit 30 is activated while the drive signal DRVE is being inputted.

As described above, the control signal for the driving circuit 20 and the auxiliary driving circuit 30 is made in common, whereby the number of the control signals can be reduced, and the simplification of the timing of control and the simplified control over the circuit are feasible.

The auxiliary driving circuit which accelerates the drive described above monitors the signal transition of the load of the distributed parameter circuit driven on one side, and autonomously accelerates the drive. Most of the address decoder and the logic circuit are omitted, and the drive at the speed near the drive on both ends can be realized with a small area. However, in the case in which it is necessary to set buffer voltage at the falling edge of the pulse like a CMOS image sensor, it is sometimes difficult to design a plurality of threshold logics.

For example, in a solid state imaging device in which it is necessary to drive from −1 V to 3.3 V the gate electrode of a transfer transistor which is arranged in the unit pixel of the solid state imaging device in negative voltage drive, the gate electrode is sometimes driven through 0 V at the time when it falls from 3.3 V to −1 V. An exemplary configuration which implements this will be described with reference to a block diagram shown in FIG. 15, a circuit diagram shown in FIG. 16, and a timing chart shown in FIG. 17.

Figure 15:
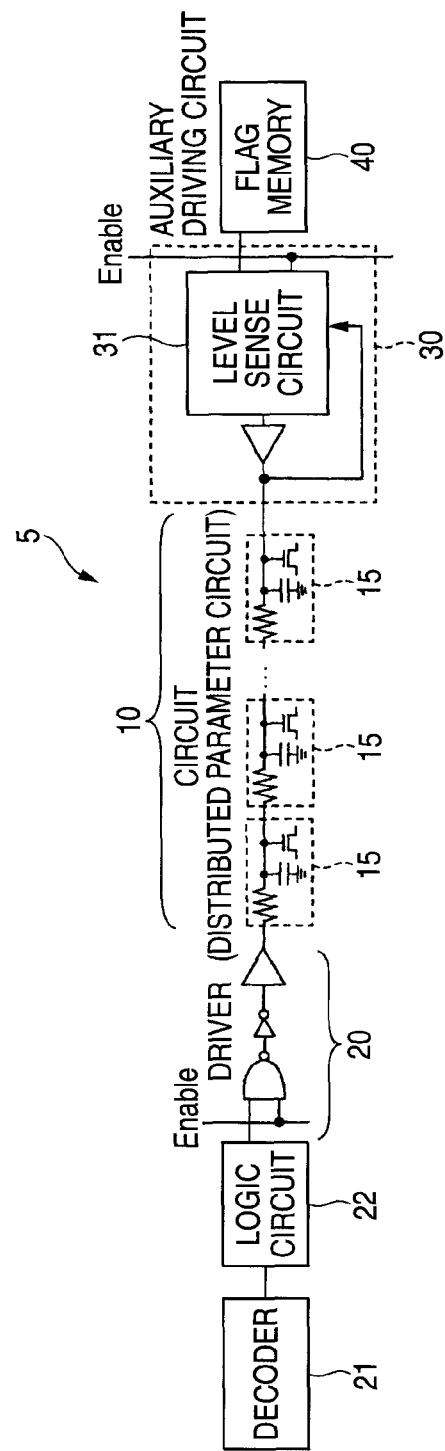
FIG. 15 shows a block diagram depicting an embodiment of the invention.

As shown in FIG. 15, in a semiconductor device 5, a circuit 10 (for example, a distributed parameter circuit) that has loads 15 is provided. A driving circuit 20 which drives the circuit 10 is connected to one end of the circuit, and an auxiliary driving circuit 30 which accelerates the drive of the driving circuit 20 is connected to the other end of the circuit 10, as the auxiliary driving circuit receives the drive signal of the driving circuit 20 as an input signal. The auxiliary driving circuit 30 monitors the signal transition of the loads 15 of the circuit 10, having a level sense circuit 31 formed of a logic with a logic threshold, and a flag memory 40 which temporarily stores the state of accelerated drive, in which each output of the level sense circuit 31 and the flag memory 40 is used for determining the drive to drive the loads 15. Furthermore, a decoder 21 is connected to the driving circuit 20 through a logic circuit 22, for example.

In the semiconductor device 5, the signal level of the loads 15 of the distributed parameter circuit changed by the driving circuit 20 is monitored, and the auxiliary driving circuit 30 accelerates the drive when a transition occurs. At this time, the flag memory 40 stores the event that drive is generated. The drive at the falling edge is determined in accordance with the state of the flag memory 40, and it is driven by the auxiliary driving circuit 30. The order of operation of the rising edge and the falling edge may be reversed.

Next, an exemplary circuit of the auxiliary driving circuit 30 will be described with reference to FIG. 16, and the operation of the auxiliary driving circuit 30 will be described with reference to a timing chart shown in FIG. 17. In addition, a dotted line in FIG. 17 shows the case in which there is no auxiliary driving circuit.

Figure 16:
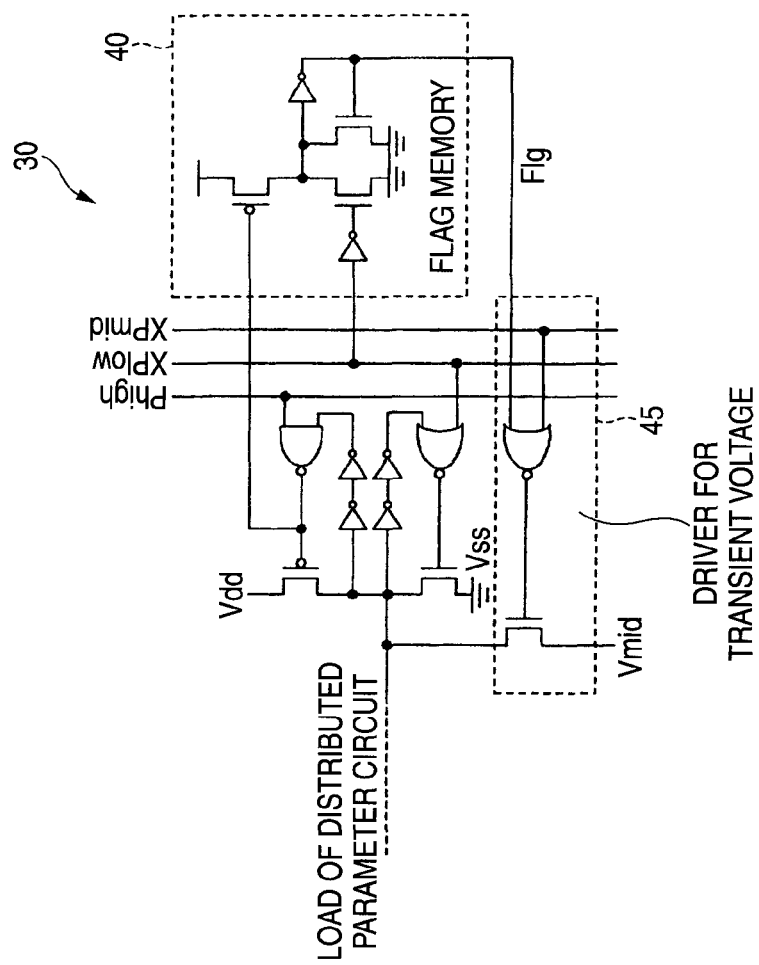
FIG. 16 shows a circuit diagram depicting the essential part of the configuration shown in FIG. 15.
Figure 17:
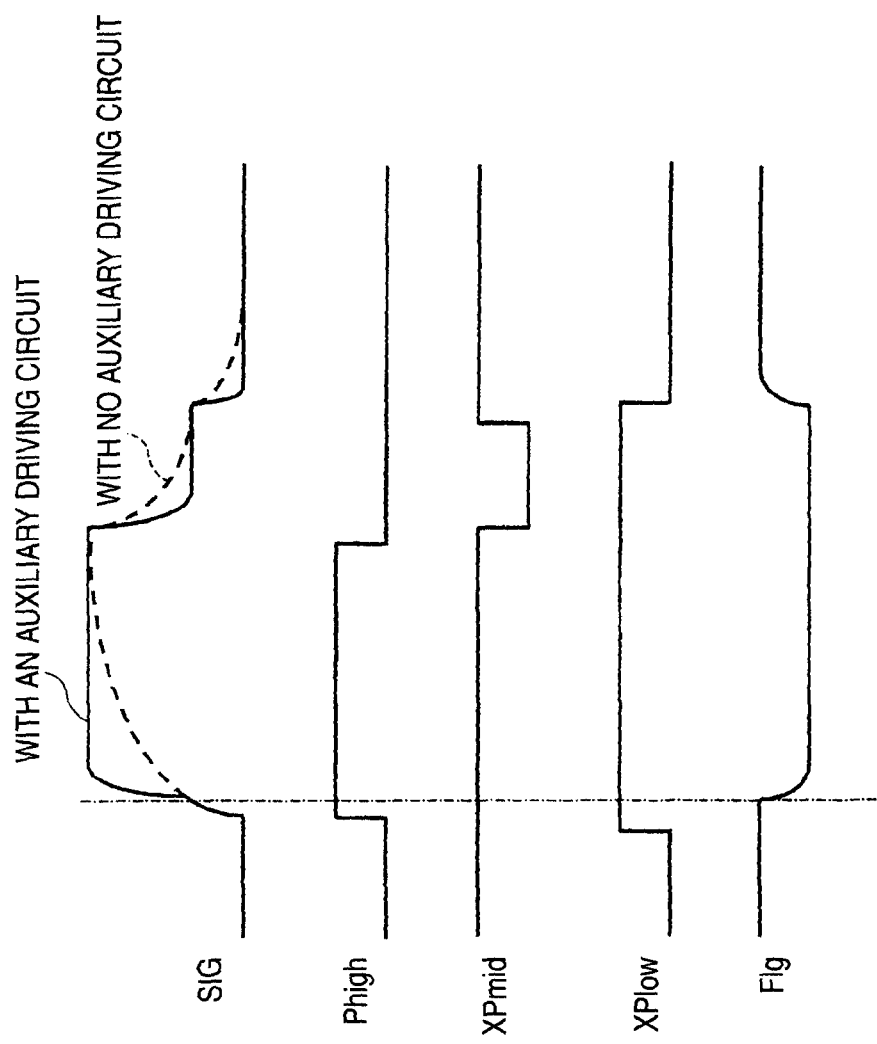
FIG. 17 shows a timing chart depicting the operation of the auxiliary driving circuit shown in FIG. 15.

As shown in FIGS. 16 and 17, an auxiliary driving circuit 30 is the same as those described in FIGS. 1 and 9. As compared with the case in which there is no auxiliary driving circuit, for the voltage SIG of the load of the distributed parameter circuit, the auxiliary driving circuit 30 is used to accelerate the rising edge of the voltage SIG for accelerating the drive at the time when the rising edge exceeds a certain level, for example, at the time when it exceeds the logic threshold Vth. At this time, a flag memory 40 stores the driving state, and an intermediate voltage Vmid is supplied by XPmid which supplies buffer voltage to a driver 45 for transient voltage. The flag memory 40 is reset at the timing that Vss of off voltage is supplied to XPlow, and a level sense circuit 31 automatically falls to the OFF state to end the sequence of pulse drive. Flg in the drawing indicates the output voltage of the flag memory 40. Furthermore, the auxiliary driving circuit 30 has the driver 45 for transient voltage which temporarily stores a predetermined voltage when the load falls, and then to which intermediate voltage is supplied when falling.

In the semiconductor device 5, attention is focused on the signal line which changes to high level right before it needs the supply of buffer potential. When the auxiliary driving circuit 30 accelerates the high level drive, the flag memory 40 is written, and then it is determined that buffer voltage is supplied. The flag memory 40 is reset when the low level drive is accelerated through buffer voltage, and the state returns to the original state. More specifically, since one logic threshold Vth at the rising edge is set to automatically set the conditions to generate the falling edge, it is unnecessary to set the logic threshold at the falling edge. As described above, an advantage of packaging density can be obtained by the reduction in the area while the drive characteristics near the drive at both ends are realized.

Figure 18:
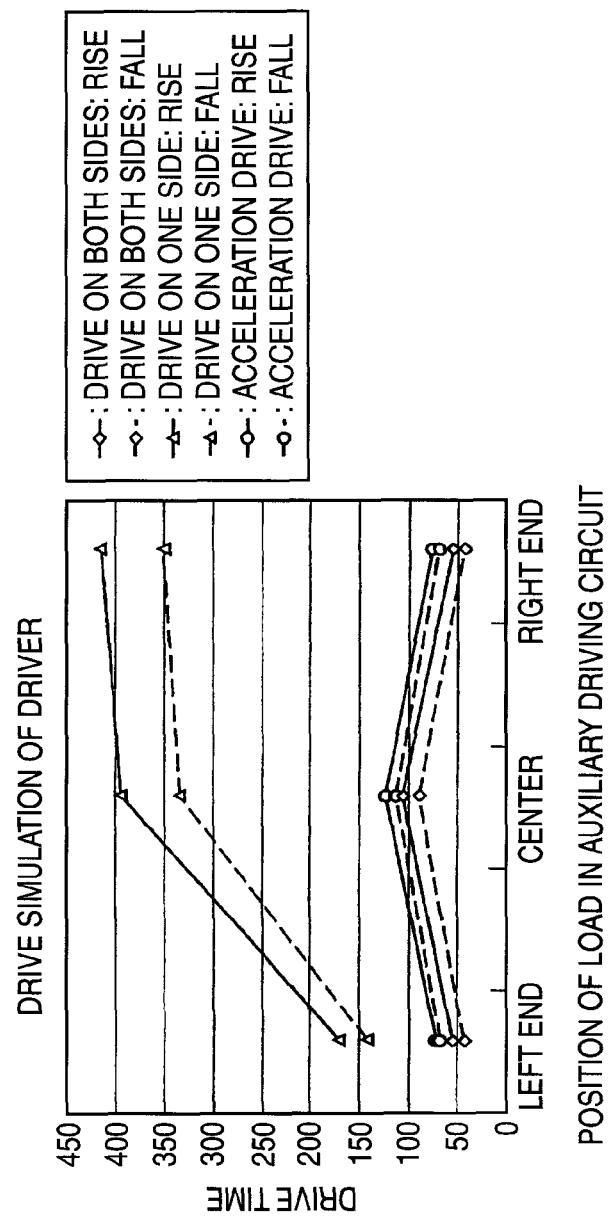
FIG. 18 shows a diagram depicting the relation between the position and the driving time of the load of the distributed parameter circuits according to an embodiment of the invention and the technique in the past.
Figure 23:
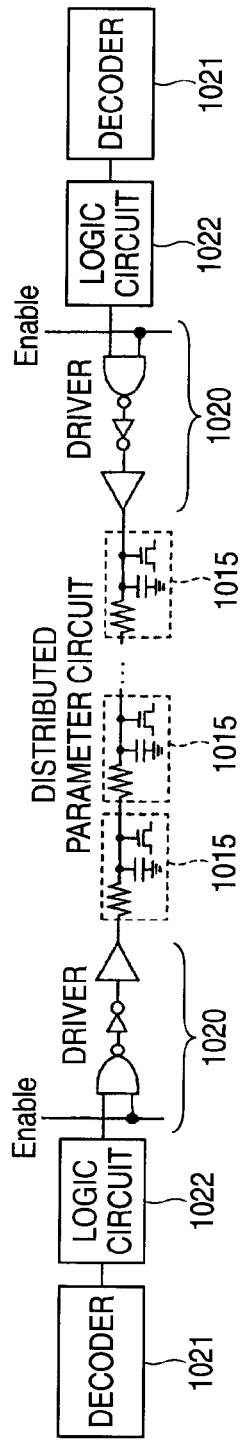
FIG. 23 shows a block diagram depicting the configuration of drive on both ends in technique in the past.

Next, the simulation results in which the distributed parameter circuits are driven in the configuration of acceleration drive by the semiconductor device 1 described in FIG. 1, the configuration of drive on both ends and the configuration of drive on one side in technique in the past described in FIGS. 23 and 24 will be described with reference to FIG. 18. In FIG. 18, the driving time is represented on the vertical line, and the position of the load in the distributed parameter circuit is represented on the horizontal line. In addition, the number of the loads of the distributed parameter circuit in each of the semiconductor devices was 1024 loads. In the drive on one side, the driving circuit was arranged on the left side of the distributed parameter circuit. In the drive on both ends, the driving circuit was arranged on the both ends of the distributed parameter circuit. In the semiconductor device according to an embodiment of the invention (acceleration drive), the driving circuit was arranged on the left side of the distributed parameter circuit, and the auxiliary driving circuit was connected on the right side of the distributed parameter circuit. In addition, the size of the drive transistor was all the same.

As shown in FIG. 18, in the semiconductor device in the drive on one side, the delay time is noticeably prolonged at the position separated from the driving circuit, whereas in the semiconductor device with the auxiliary driving circuit, it has the delay characteristics near the drive on both ends, and the drive is more significantly accelerated than the drive on one side. Furthermore, an advantage of reduction in the circuit area in drive on both ends is as discussed above. As described above, the configuration in which the auxiliary driving circuit is arranged is significantly effective for efficiently reducing the circuit scale, and for decreasing differences in delay in the circuit for acceleration.

Figure 19:
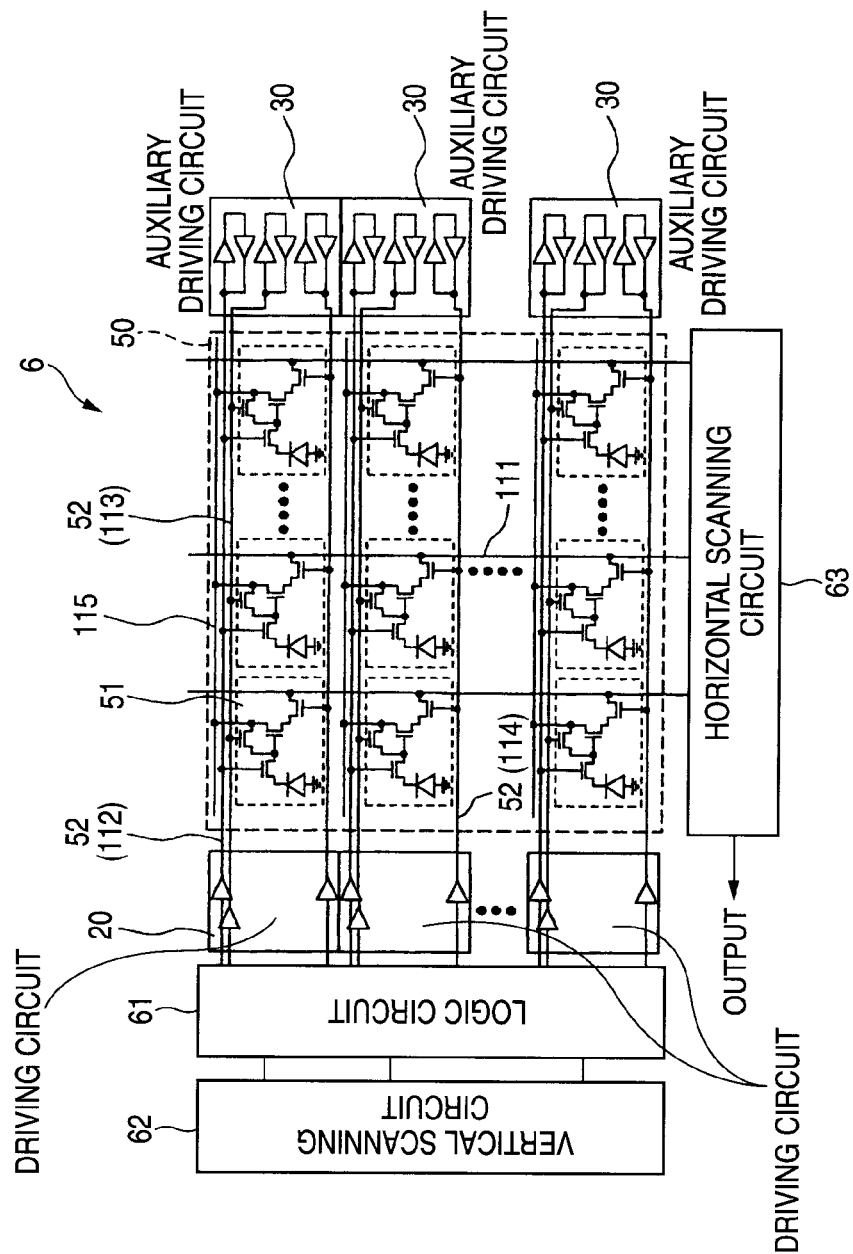
FIG. 19 shows a block diagram depicting an example in which a semiconductor device according to an embodiment of the invention is adapted to a solid state imaging device.
Figure 20:
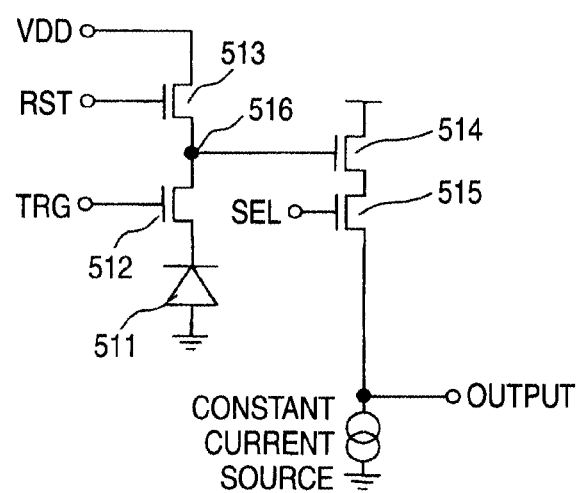
FIG. 20 shows a circuit diagram depicting an exemplary pixel part.

Next, an exemplary configuration in which the semiconductor device according to an embodiment of the invention is a solid state imaging device will be described with reference to a block diagram shown in FIG. 19 and an enlarged diagram shown in FIG. 20. In FIG. 19, as an example, a MOS image sensor is shown.

As shown in FIG. 19, in a semiconductor device (solid state imaging device) 6, pixels 51 are arranged two dimensionally in a matrix in the vertical direction (x direction) and the horizontal direction (y direction). Each of the pixels 51 in the pixel row is connected and controlled by a control signal line 52.

The MOS image sensor has a pixel array part 50 in which the pixels 51 including a photoelectric conversion element are arranged two dimensionally in a matrix, and as peripheral circuits, a driving circuit 20 which drives the control signal line 52, a logic circuit 61 which controls the driving circuit 20, a vertical scanning circuit 62, a timing generating circuit (not shown), and a horizontal scanning circuit 63. To the MOS image sensor, auxiliary driving circuits 30 which accelerate the drive with the drive signal as an input signal are connected to the opposite side on which the logic circuit 61 of the control signal line 52 is connected. For example, for the control signal line 52, there are a transfer control line 112, a reset control line 113 and a selection control line 114. Therefore, the auxiliary driving circuit 30 is connected to each of the transfer control line 112, the reset control line 113 and the selection control line 114.

In the configuration, a row selected by the vertical scanning circuit 62 and the logic circuit 61 is driven by the driving circuit 20 from one side. Since the auxiliary driving circuits 30 are arranged on the opposite side, the drive of the control signal line (horizontal signal line) 52 for the row driven by the driving circuit 20 can be accelerated.

Furthermore, an output signal line 111 is wired to every column with respect to the matrix array formed of the pixels 51 in the pixel array part 50. Moreover, to each of the pixels 51, a reset line 115 is wired which supplies reset voltage.

An exemplary circuit configuration of the pixel 51 will be described with reference to an enlarged diagram shown in FIG. 20. The unit pixel of this exemplary circuit has a photoelectric conversion element, a photodiode 511, for example, configuring a pixel circuit including four transistors, a transfer transistor 512, a reset transistor 513, an amplifier transistor 514 and a selection transistor 515, for example. Here, an N channel MOS transistor is used for the transfer transistor 512, the reset transistor 513, the amplifier transistor 514 and the selection transistor 515, for example.

The transfer transistor 512 is connected between the cathode electrode of the photodiode 511 and a floating diffusion part 516 which is a charge voltage converting part, in which a transfer pulse TRG is applied to the gate electrode (control electrode) to transfer signal electric charge (here, electrons) that is photoelectrically converted by the photodiode 511 and stored here to the floating diffusion part 516.

In the reset transistor 513, the drain electrode is connected to the reset line 115, and the source electrode is connected to the floating diffusion part 516, in which prior to the transfer of the signal electric charge from the photodiode 511 to the floating diffusion part 516, a reset pulse RST is applied to the gate electrode to reset the potential of the floating diffusion part 516 to a reset voltage Vrst.

In the amplifier transistor 514, the gate electrode is connected to the floating diffusion part 516, and the drain electrode is connected to the pixel source Vdd, in which the potential of the floating diffusion part 516 after reset by the reset transistor 513 is outputted as reset level, and the potential of the floating diffusion part 516 to which the signal electric charge has been transferred by the transfer transistor 512 is outputted as signal level.

For example, in the selection transistor 515, the drain electrode is connected to the source electrode of the amplifier transistor 514, and the source electrode is connected to the output signal line 111, in which a selection pulse SEL is applied to the gate electrode to turn to the ON state and to turn the pixel 51 to the selected state, and a signal outputted from the amplifier transistor 514 is outputted to the output signal line 111. In addition, for the selection transistor 515, such a configuration may be adopted that the selection transistor 515 is connected between the pixel source Vdd and the drain electrode of the amplifier transistor 514.

Furthermore, returning to FIG. 19, the description will be continued. The driving circuit 20 is configured to perform the read operation which reads the signal of each of the pixels 51 in the read row of the pixel array part 11.

The vertical scanning circuit 62 is configured of a shift register or an address decoder, for example, in which the reset pulse RST, the transfer pulse TRG and the selection pulse SEL are properly generated to scan each of the pixels 51 of the pixel array part 10 in the electronic shutter row and the read row in units of rows vertically (in the vertical direction), at the same time, the electronic shutter operation is performed to sweep the signal of the pixel 51 in the row with respect to the electronic shutter row. Then, the electronic shutter operation is performed with respect to the same row (electronic shutter row) the time period corresponding to the shutter speed before read scanning is performed by the driving circuit 20.

The horizontal scanning circuit 63 is configured of a shift register or an address decoder, for example, which horizontally scans at every pixel column of the pixel array part 10.

According to the semiconductor device 6 (solid state imaging device), the auxiliary driving circuits 30 are arranged on the opposite side of the driving circuits 20 of the control signal line 52, whereby the portions of the vertical scanning circuit and the logic circuit can be omitted on the side on which the auxiliary driving circuits 30 are arranged.

Therefore, an advantage of reduction in the circuit area can be obtained as well as the drive speed can be accelerated by the auxiliary driving circuit 30 and the delay distribution of the accelerated horizontal signal line can be uniformized, contributing to the improvement of performance of the solid state imaging device. Similar advantages can be obtained in the similar configurations not only in the CMOS image sensor but also in the drive of the horizontal signal line of a CCD.

Figure 21:
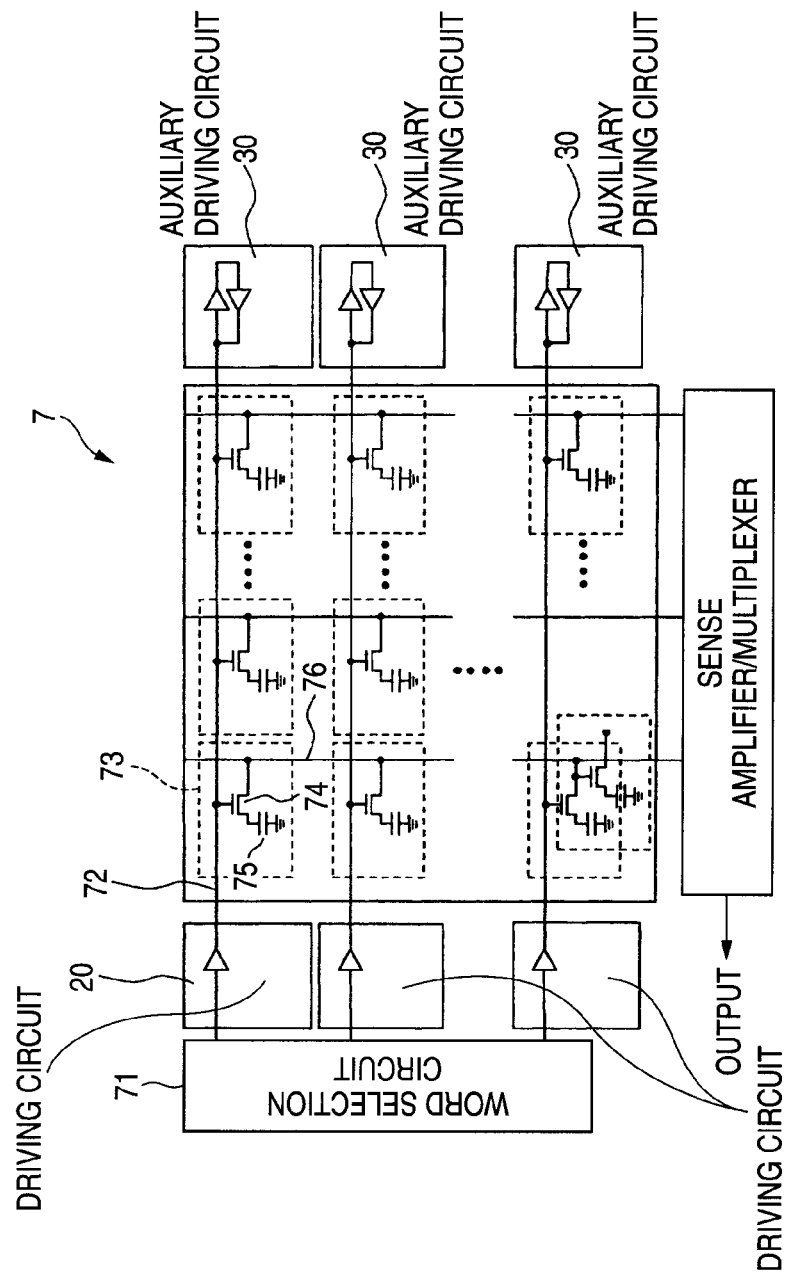
FIG. 21 shows a block diagram depicting an example in which the semiconductor device according to an embodiment of the invention is adapted to a storage device.

Next, an exemplary configuration in which the semiconductor device according to an embodiment of the invention is a storage device will be described with reference to a block diagram shown in FIG. 21. In FIG. 21, as an example, a dynamic random access memory (DRAM) is shown.

As shown in FIG. 21, a semiconductor device (storage device) 7 has an array in which a memory element with a single transistor and a single capacitor is arranged in an array vertically and horizontally. A word selection circuit 71 selects a word selection line 72, and the line is driven by a driving circuit 20 to write or read data in a predetermined storage element 73.

An auxiliary driving circuit 30 is arranged on the opposite side end to which the driving circuit 20 on the word selection line 72 is connected. For example, for the auxiliary driving circuit 30, the auxiliary driving circuits in the configurations described in FIGS. 4A to 6B, and FIGS. 9A and 9B can be used. In the storage element 73, the word selection line 72 is connected to the gate of a MOS transistor 74, a bit line 75 is connected to one side of the MOS transistor, and a capacitor 76 is connected to the other side. In the storage device 7, the auxiliary driving circuit 30 accelerates the drive of the word selection line 72.

In the write operation, voltage is applied to the word selection line 72 which is to select a row, data is passed to the corresponding bit line 75, and then the row is selected to apply voltage to the gate of the MOS transistor 74. Thus, information is stored in the capacitor 76 of the cell in which the source and drain of the MOS transistor 74 are conducting.

In the read operation, first, the bit line 75 is set to the same voltage as a pre-charge power line (not shown). The voltage of the pre-charge power line is set to the threshold voltage of a sense amplifier. Subsequently, the pre-charge switch is turned off, and the voltage pre-charged in the bit line 75 is retained for a while. Then, the word selection line 72 is selected to apply voltage. Thus, the source and drain of the MOS transistor 74 are conducted to pass information in the capacitor 76 to the bit line 75. Since the bit line 75 has pre-charge voltage, it becomes a voltage value exceeding the threshold voltage when the capacitor 76 has electric charge, whereas it becomes a voltage value below the threshold voltage when it has no electric charge. Here, voltage is applied to the control terminal of the sense amplifier to activate the sense amplifier, and the voltage value of the bit line 75 is changed to the voltages corresponding to "1" and "0" with reference to the threshold voltage. At this time, the same data is again stored in the capacitor 76 of the memory cell. Finally, the column selection switch is turned to the ON state to output information in the bit line 75.

According to the semiconductor device 7 (storage device), the auxiliary driving circuit 30 is arranged on the opposite side of the driving circuit 20 of the word selection line 72, whereby the word selection circuit 71 can be omitted on the side on which the auxiliary driving circuit 30 is arranged. Therefore, the advantage of reduction in the circuit area can be obtained, as well as the drive speed can be accelerated by the auxiliary driving circuit 30 and the delay distribution of the accelerated horizontal signal line can be uniformized, contributing to the improvement of the read rate and write rate of the storage device.

Figure 22:
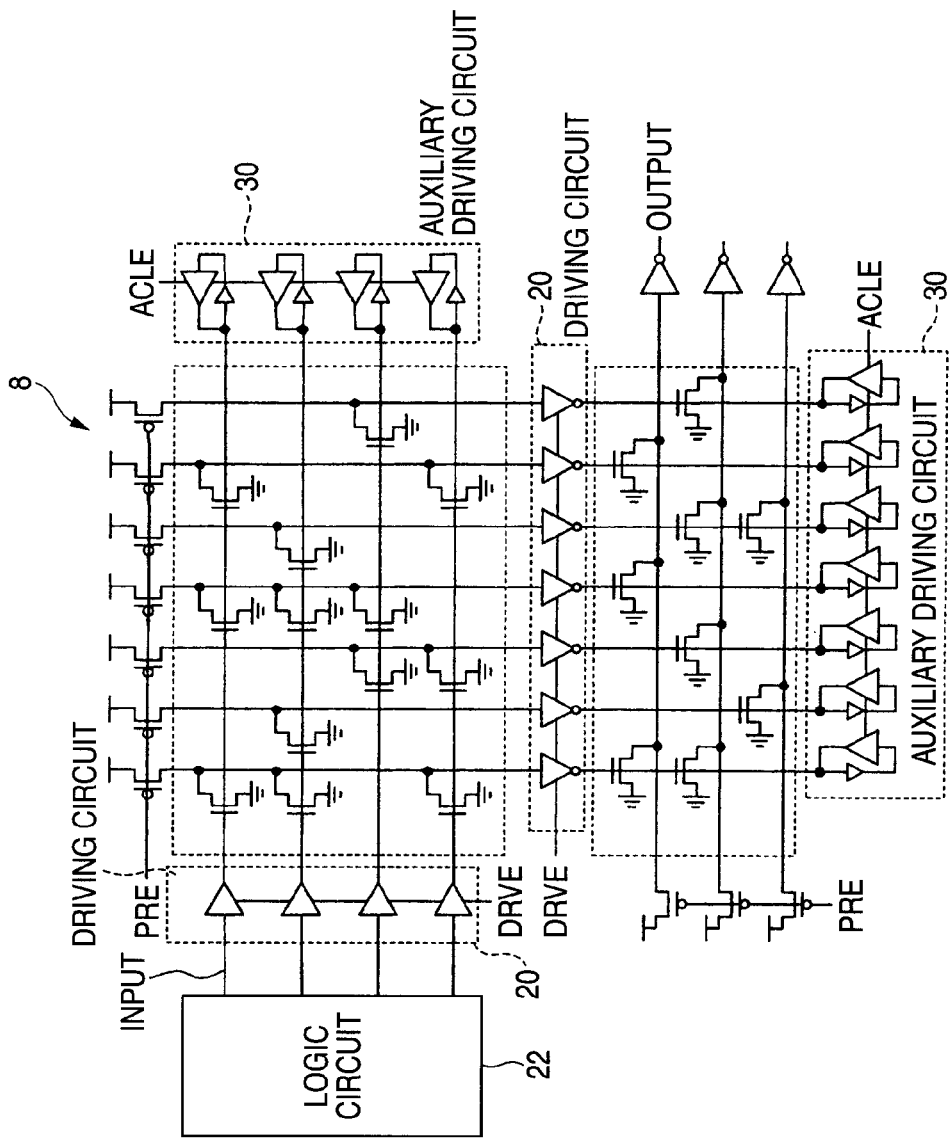
FIG. 22 shows a block diagram depicting an example in which the semiconductor device according to an embodiment of the invention is adapted to a programmable logic array.

Next, an exemplary configuration in which the semiconductor device according to an embodiment of the invention is a storage device will be described with reference to a block diagram shown in FIG. 22. In FIG. 22, as an example, a programmable logic array configured of a PLA (Programmable Logic Array) formed of a dynamic logic circuit is shown.

As shown in FIG. 22, a semiconductor device (programmable logic array) 8 is a PLA (Programmable Logic Array) formed of a dynamic logic circuit. It is considered that a driving circuit 20 turns all the outputs to low level when it is deactivated by a drive signal DRVE. After pre-charged by a PRE signal, when an input from the logic circuit 22 in the previous stage is determined, the driving circuit 20 is activated by the drive signal DRVE of the driving circuit 20. When the auxiliary driving circuit 30 is activated by the activation signal ACLE of the auxiliary driving circuit 30, the transition at the rising edge can be accelerated.

According to the semiconductor device (programmable logic array) 8, the drive of the programmable logic array can be accelerated. Particularly, since it is generally difficult to form the configuration of the drive on both ends because of the flow of logic computation, the semiconductor device provides the advantage that accelerates the signal line that is formed of the distributed parameter circuit.

The semiconductor device according to an embodiment of the invention serves for reduction in the area as well as for acceleration of the driving circuit for the control signal line with the distributed parameter circuit as a load, including a solid state imaging device such as a CMOS image sensor and a charge coupled device (CCD), a storage device such as a dynamic random access memory (DRAM), a static random access memory (SRAM), a read only memory (ROM), and a nonvolatile memory, and a programmable logic array such as PLA.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device comprising:
a plurality of pixels;
a control signal line connected to the plurality of pixels;
a driving circuit configured to output a drive signal to the control signal line; and
an auxiliary driving circuit configured to receive the drive signal propagated through the control signal line,
wherein,
the auxiliary driving circuit comprises a loop circuit having an input node and an output node,
the input node and the output node of the loop circuit are connected to the control signal line,
the loop circuit is configured to be switched between activating the auxiliary drive circuit via a first state of an activation signal and deactivating the auxiliary drive circuit via a second state of the activation signal, and
while the activation signal is in the first state, the auxiliary driving circuit is configured to accelerate the drive signal when the drive signal transitions from a high state to a low state.

2. The imaging device according to claim 1, comprising a plurality of auxiliary driving circuits.

3. The imaging device according to claim 2, the plurality of auxiliary driving circuits is connected to single activation signal line supplying the activation signal.

4. An imaging device comprising:
a plurality of pixels;
a control signal line connected to the plurality of pixels;
a driving circuit configured to output a drive signal to the control signal line; and
an auxiliary driving circuit configured to receive the drive signal propagated through the control signal line,
wherein,
the auxiliary driving circuit comprises a loop circuit having an input node and an output node,
the input node and the output node of the loop circuit are connected to the control signal line, and
the loop circuit is configured to be switched between activating the auxiliary drive circuit and deactivating the auxiliary drive circuit independently of the drive signal.

5. The imaging device according to claim 4, comprising a plurality of auxiliary driving circuits.

6. The imaging device according to claim 5, the plurality of auxiliary driving circuits is connected to single activation signal line supplying the activation signal.

7. An imaging device comprising:
a plurality of pixels;
a control signal line connected to the plurality of pixels;
a driving circuit configured to output a drive signal to the control signal line; and
an auxiliary driving circuit configured to receive the drive signal propagated through the control signal line,
wherein,
the auxiliary driving circuit comprises a loop circuit having an input node and an output node,
the input node and the output node of the loop circuit are connected to the control signal line,
the driving circuit is configured to receive an activation signal, and output the drive signal to the control signal line according to the activation signal, and
the loop circuit is configured to be switched between activating the auxiliary drive circuit and deactivating the auxiliary drive circuit according to the activation signal.

8. The imaging device according to claim 7, comprising a plurality of auxiliary driving circuits.

9. The imaging device according to claim 8, the plurality of auxiliary driving circuits is connected to single activation signal line supplying the activation signal.

10. An imaging device comprising:
a plurality of pixels are arranged in rows and columns;
a plurality of control signal lines, each of the plurality of control signal lines is connected to the pixels arranged in the same row;
a plurality of driving circuits; and
a plurality of auxiliary driving circuits,
wherein,
each of the plurality of driving circuits is connected to a first end of one of the plurality of control signal lines,
each of the auxiliary driving circuits comprises a loop circuit having a first input node, a second input node, and an output node,
the first input node and the output node are connected to a second end of one of the control signal line, and
each of the second input nodes is commonly connected to an activation signal line.

* * * * *